United States Patent
Yum et al.

(10) Patent No.: US 6,627,060 B1
(45) Date of Patent: Sep. 30, 2003

(54) METHOD FOR PHOSPHOR COATING ON FLAT DISPLAY USING ELECTROPHORETIC DEPOSITION AND PHOTOLITHOGRAPHY

(75) Inventors: Jun Ho Yum, Seoul (KR); Yung Eun Sung, Kwangju Kwangyeok-si (KR)

(73) Assignee: Kwangju Institute of Science and Technology, Kwangju Kwangyeok-Si (KR)

( * ) Notice: Subject to any disclaimer, the term of this patent is extended or adjusted under 35 U.S.C. 154(b) by 164 days.

(21) Appl. No.: 09/695,072

(22) Filed: Oct. 25, 2000

(30) Foreign Application Priority Data

Aug. 17, 2000 (KR) ........................... 2000-47349

(51) Int. Cl.[7] ................ C25D 15/00; C25D 1/12; C25D 1/18
(52) U.S. Cl. .................. 204/478; 204/471; 204/480; 204/489; 204/506
(58) Field of Search ............... 204/478, 471, 204/489, 506, 480

(56) References Cited

U.S. PATENT DOCUMENTS 4,891,110 A * 1/1990 Libman et al. ............ 204/478

OTHER PUBLICATIONS

Sasaki, et al., Deposition of Powder Phosphors for Information Displays, *Advanced Materials*, vol. 11, No. 2, 1999, pp. 91–105.

* cited by examiner

*Primary Examiner*—James J. Seidleck
*Assistant Examiner*—Thao Tran
(74) *Attorney, Agent, or Firm*—Rosenberg, Klein & Lee

(57) ABSTRACT

A method for coating a phosphor on a flat display using electrophoretic deposition (EPD) and lithography is provided. In the method, an adhesive strength can be enhanced without passing through a high-temperature thermal treatment process as a post-process. Phosphor powders are coated on a substrate by a field emission display (FED) and then a ultraviolet (UV) curable layer is coated. Then, an adhesive strength of the phosphor can be greatly enhanced through UV irradiation, in comparison with a post-process such as a thermal treatment process. Also, the UV curable layer can be lithographically etched by the UV light, and thus the phosphor can be coated by a predetermined pattern, to then be applied to a next-generation display such as a FED or PDP as an optimal method for full color realization.

3 Claims, 11 Drawing Sheets

METHOD FOR PHOSPHOR COATING ON FLAT DISPLAY USING ELECTROPHORETIC DEPOSITION AND PHOTOLITHOGRAPHY

BACKGROUND OF THE INVENTION

1. Field of the Invention

The present invention relates to a method for coating a phosphor on a flat display using electrophoretic deposition (EPD) and photolithography, and more particularly, to a method for coating a phosphor on a flat display in which EPD and UV lithography are combined to make a simple and reliable phosphor coated film to thereby enhance an adhesive strength greatly to accordingly heighten stability, and a photoresist is used to make a RGB phosphor pattern for embodying full colors according to the photolithography.

2. Description of Prior Art

A phosphor coating technology is essential in a display or light emitting diode (LED) industrial field. Electrophoretic deposition (EPD) is recently spotlighted among a variety of coating technologies. In particular, the EPD is essential for embodying a flat display such as a FED (Field emission Display) or a PDP (Plasma Display Panel). Phosphor coating technologies, which have been known, will now be described.

Firstly, there is a slurry method. In the case of the slurry method, a phosphor is dispersed uniformly on a photoresist (PR) and then an adding agent such as an interface active agent and a dispersion agent are put in order to make slurry. Then, the slurry is coated on a panel and ultra-violet (UV) cured to make a phosphor film (see Advanced Materials, pp95–97, No. 2, November 1999).

Secondly, there is an electrophotographic method. In the case of the electrophotographic method, a photoconductive layer is formed and exposed via a shadow mask to make a conductive pattern. Then, a phosphor carrying frictional charges is coated thereon (see Advanced Materials, pp97–99, No. 2 November 1999).

Thirdly, there is a settling method. In the case of the settling method, an alkali solution including silicic acid is dispersed in a phosphor. Then, phosphor partilces are settled, dried and coated thereon (Advanced Materials, pp100–101, No. 2, November 1999).

Also, there is an electrophoretic deposition (EPD) method that has been recently noted. Electrophoretic deposition means a phenomenon that electrically charged particles are moved in a suspension by an electrical field. In the case of the EPD, a phosphor is electrically charged by adding a proper amount of an electrolyte in a predetermined suspension, and is biased by an electrical field. Then, surface charged phosphor particles are moved to an electrode of a counter-polarity and coated on the electrode. In this case, nitrocellulose, acryl resin or nitrate groups are used as the additives for enhancing an adhesive strength with respect to a substrate (electrode).

In the case of a transmissive flat display such as a FED, a phosphor density should be smaller than several milligrams per square centimeter ($mg/cm^2$). In the case of the EPD, an electrolyte such as Mg nitrate, La nitrate, Y nitrate is dissolved in IPA (isopropyl alcohol) and then a phosphor is dispersed and biased by an electrical field, to thereby coat the phosphor on a substrate. In this case, an annealing process is performed for one hour at 425° C. as a post-process in order to enhance an adhesive strength (see Advanced Materials, pp101–102, No. 2, November 1999).

Besides, there are various methods including a screen printing method and so on.

As described above, there have been known many technologies such as a slurry method, an electrophotographic method, and a settling method as the conventional phosphor coating methods. However, displays manufactured according to the above conventional methods do not satisfy conditions necessary for high-information content displays. Further, most of the displays have been designed to be adapted to displays such as CRTs (Cathode Ray Tubes), which are driven by high electron energy of 10–40 KeV.

However, a next-generation display, e.g. FED is driven at low voltage of 500–1000V. Accordingly, a thin phosphor screen is required. Here, the EPD is used for coating the thin phosphor screen. However, in the case that a phosphor is coated via the EPD, glycerin is added in an electrolyte solution in order to enhance an adhesive strength between the phosphor and a substrate, since the adhesive strength of the phosphor is weak, or an annealing process should be performed for one hour or so at 425° C.

SUMMARY OF THE INVENTION

To solve the prior art problems, it is an object of the present invention to provide a method for coating a phosphor on a flat display using electrophoretic deposition (EPD) and photolithography, and more particularly, to a method for coating a phosphor on a flat display in which EPD and UV lithography are combined to make a simple and reliable phosphor coated film to thereby enhance an adhesive strength greatly to accordingly heighten stability, and a photoresist is used to make a RGB phosphor pattern for embodying full colors according to the photolithography.

To accomplish the above object of the present invention, according to the present invention, there is provided a method for coating a phosphor on a flat display, the method comprising the steps of: forming a conductive layer on a glass substrate; coating a phosphor on the conductive layer by electrophoretic deposition using a phosphor suspension in which a phosphor to be coated has been dispersed; and forming an adhesive layer by coating a UV curable layer on the upper surface of the substrate, and curing the UV curable layer by irradiating UV light.

According to another aspect of the present invention, there is provided a method for coating a phosphor on a flat display, the method comprising the steps of: (a) forming a conductive layer on a glass substrate; (b) forming a first photoresist layer on the conductive layer, and patterning the first photoresist layer into a desired first pattern, to thereby form a plurality of first windows with respect to the conductive layer; (c) selectively coating a first phosphor on the conductive layer through the plurality of the first windows by electrophoretic deposition using a first phosphor suspension in which a phosphor to be coated has been dispersed, to thereby form a plurality of first phosphor pattern cells; (d) forming a first UV curable layer on the upper surface of a substrate including the coated and exposed first phosphor pattern cells, and selectively curing the first UV curable layer by selectively irradiating UV light to the upper portions of the first phosphor pattern cells, to thereby selectively form a plurality of first adhesive layers in the exposed portions of the first phosphor pattern cells; (e) forming a plurality of second phosphor pattern cells coated with a second phosphor in the position adjacent the first phosphor pattern cells following the step (d), in the same manner as the first phosphor coating method, and selectively forming a plurality of second adhesive layers on the upper portions of the plurality of the second phosphor pattern cells; and (f) forming a plurality of third phosphor pattern cells coated with a third phosphor in the position adjacent the first and second phosphor pattern cells, in the same manner as the first phosphor coating method, and selectively forming a plurality of third adhesive layers on the upper portions of the plurality of the third phosphor pattern cells.

The curable layer is formed by aqueous solution containing polyvinyl alcohol (PVA) and ammonium dichromate (ADC). The aqueous solution can be formed by anyone of spraying, dipping and spin coating methods.

The first through third phosphors are made of red, blue and green phosphors for full color realization, and form a single pixel cell.

Further, it is possible to use aqueous solution containing polyvinyl alcohol (PVA) and ammonium dichromate (ADC) as the photoresist layer.

Also, in the present invention, the phosphor is coated by the EPD and then the phosphor remaining in the phosphor dispersion aqueous solution is evaporated from the aqueous solution for one hour or longer at 100° C. or higher. Then, the phosphor is collected in the form of powders via a sonic device, and the collected phosphor can be re-used.

As described above, in the present invention, the EPD and UV lithography are combined to make a simple and reliable phosphor coated film to thereby enhance an adhesive strength greatly to accordingly heighten stability, and a photoresist is used to make a RGB phosphor pattern according to the photolithography, to thereby embody a full color flat display.

BRIEF DESCRIPTION OF THE DRAWINGS

The above object and other advantages of the present invention will become more apparent by describing the preferred embodiment thereof in more detail with reference to the accompanying drawings in which.

DETAILED DESCRIPTION OF THE EMBODIMENT

A preferred embodiment of the present invention will be described in more detail with reference to the accompanying drawings.

FIGS. 1a through 1i are sectional views for explaining a method for coating phosphor on a flat display using electrophoretic deposition (EPD) and photolithography (UV lithography) according to the present invention. FIGS. 2a through 2d are sectional views showing a process for fabricating a UV curable layer on a phosphor coated by an electrophoretic deposition method.

Figure 1A:
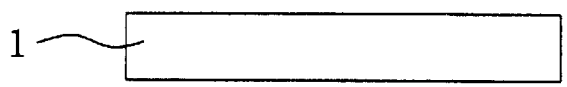
FIGS. 1a through 1i are sectional views for explaining a method for coating phosphor on a flat display using electrophoretic deposition (EPD) and photolithography (UV lithography) according to the present invention.
Figure 1B:
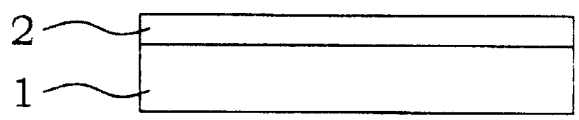

Firstly, referring to FIGS. 1a through 1i, the phosphor coating method according to the present invention uses a glass substrate 1 shown in FIG. 1a, and forms a conductive layer 2 on a substrate 1 as shown in FIG. 1b. A glass substrate in which aluminum has been sputtered or indium tin oxide (ITO) has been coated can be used as the conductive layer 2. Besides, the conductive layer 2 can be formed by spin coating or dipping an organic conductive material.

Figure 1C:
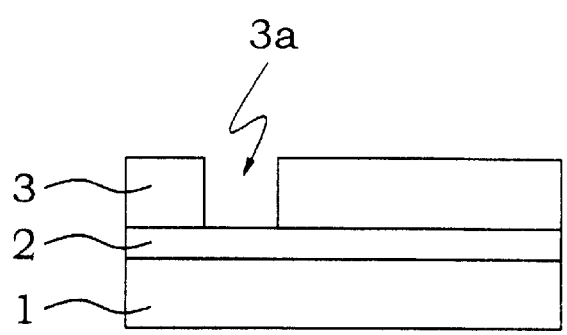

Then, in order to make a RGB pattern, a photoresist (PR) 3 is coated on the upper portion of the conductive layer 2 as shown in FIG. 1c. Then, the PR 3 is lithographically patterned in the form of a user desired pattern, for example, any one of RGB patterns necessary for full color realization, e.g., a R pattern, to thereby form a window 3a with respect to the conductive layer 2.

The PR 3 used in the above process should be selected as a material, which is insoluble in an isopropyl alcohol (IPA) solution for a post-process. The PR 3 is spin coated at 1500 rpm or faster and then is patterned via a light exposure mask. Here, a PVA plus ADC aqueous solution, which is to be used in a UV curable layer as a post-process can be used as the PR 3. The PVA+ADC film is not dissolved in a polar organic solvent such as IPA. Here, it is preferable that a thermal treatment method at 400° C. or higher is used to remove the PVA+ADC film.

Then, in order to make the phosphor (R) dispersed suspension 5a, the red phosphor (R) is dispersed in an organic solvent such as IPA where nitrate has been dissolved, acetone and ethanol.

That is, the red phosphor is dispersed in the IPA where Mg nitrate or La nitrate is dissolved, or Mg nitrate and La nitrate are mixed and dissolved. The amount of the dispersed phosphor (R) is about 2–4 g/L, and dispersion is performed well as stirring is performed longer, which takes about 12–24 hours.

Figure 1D:
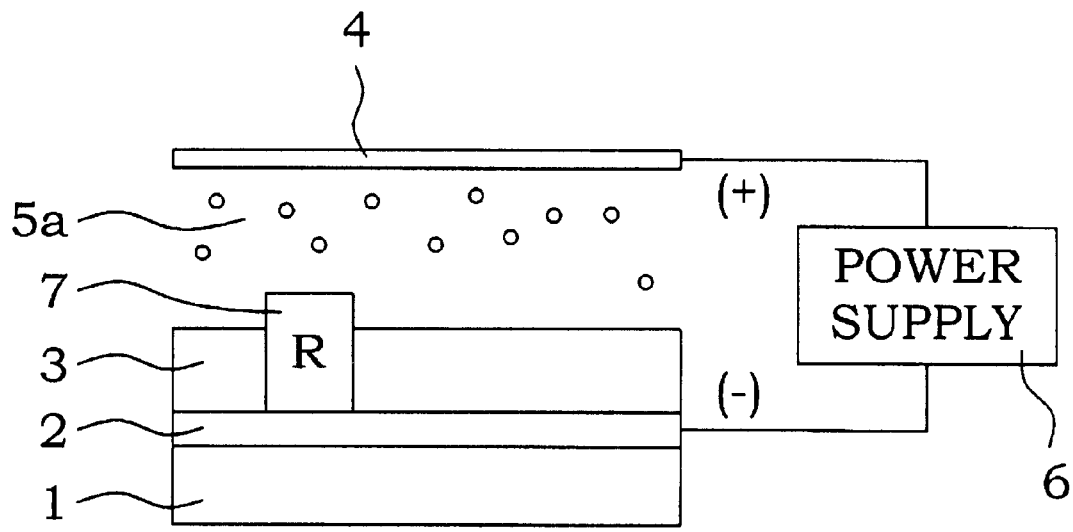

Then, the glass substrate 1 and a counter-electrode 4 are positioned in the phosphor dispersion solution 5a as shown in FIG. 1d and then the red phosphor (R) is coated by the EPD.

That is, an electrophoretic deposition cell is made and an ITO coated glass substrate is used as the substrate 1 where the red phosphor R is coated. Stainless steel or an ITO glass substrate is used as the counter-electrode 4. The negative end of a power supply 6 is connected to the conductive layer 2 on the substrate 1 where the phosphor is coated and the positive end thereof is connected to the counter-electrode 4. By doing so, voltage of 100–600V is applied for 60–300 seconds between the conductive layer 2 and the counter-electrode 4. As a result, a red phosphor (R) is coated on the exposed conductive layer 2 on the substrate 1, to thereby form a red phosphor pattern cell 7.

In this case, as an applied voltage is higher and a voltage applied time is longer, a more phosphor is coated. However, since a packing density of the coated phosphor becomes low at a low voltage or high voltage, or at the time of long-time coating, an experimental condition should be adjusted according to the kind of the phosphor and the thickness of the required coated film.

Figure 1E:
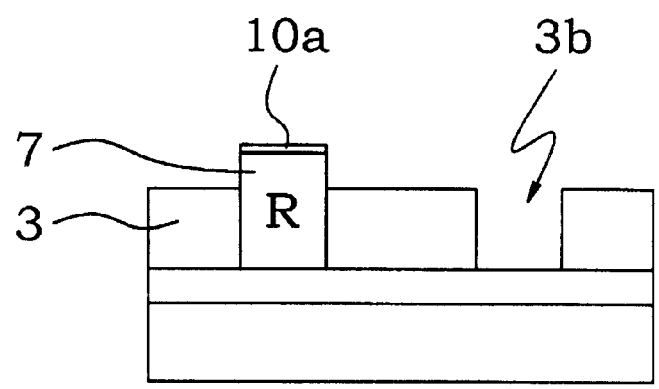

Then, as shown in FIG. 1e, a UV curable layer 10a is formed on the red phosphor (R) pattern cell 7 and selectively cured using a mask. Here, the UV curable layer 10a should be selected among transparent materials, which do not nearly influence upon a light efficiency of the phosphor.

That is, the UV curable layer 10a is formed by coating a aqueous solution in which PVA and ADC have been dissolved, on a substrate 1 coated by the red phosphor (R) pattern cell 7, by means of a spraying, dipping or spin coating method. The PVA+ADC aqueous solution that is used for the above process contains PVA of 1–2 weight %, ADC of 0.01–0.02 weight % and $H_2O$ of the residual weight %. Thereafter, the coated aqueous solution is selectively cured using ultraviolet light of 365 nm.

In this case, when the UV curable layer 10a is coated on the red phosphor (R) pattern cell 7, part of the aqueous solution is penetrated between thin-film coated phosphor particles, to thereby play a role of strengthen an adhesive strength between the phosphor particles and between the particle and the conductive layer 2 due to crosslinking of the broken PVA and the reduced Cr ion which are formed at the time of the UV curing process.

Also, the UV curable layer 10a provides an effect of making an insulation layer on the coated red phosphor (R) pattern cell 7. Therefore, the UV curable layer 10a provides a merit that a desired portion can be coated when green and blue phosphors G and B of other colors are coated by the electrophoretic deposition in the following process.

Figure 1F:
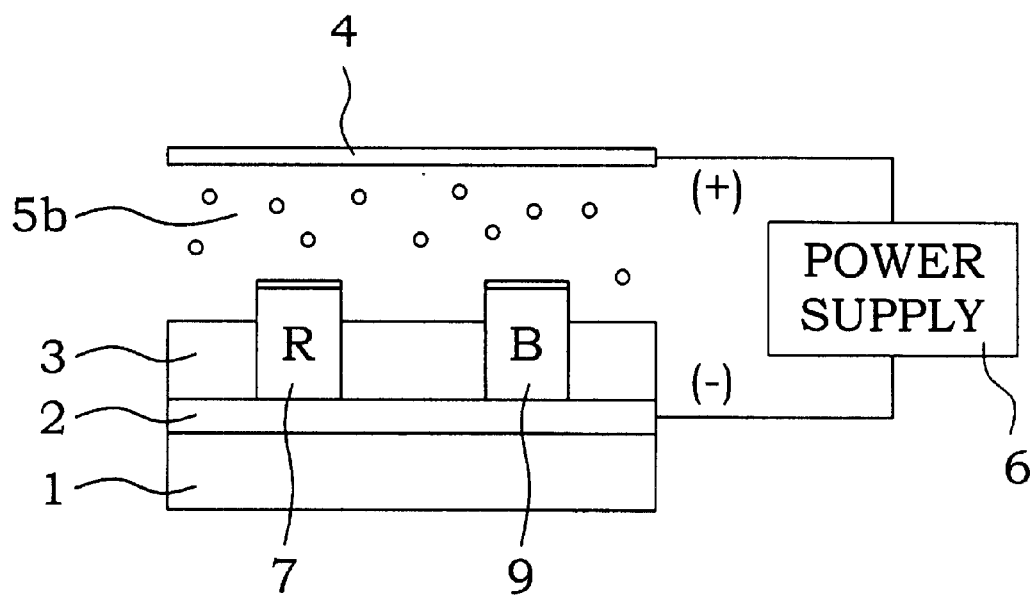
Figure 1G:
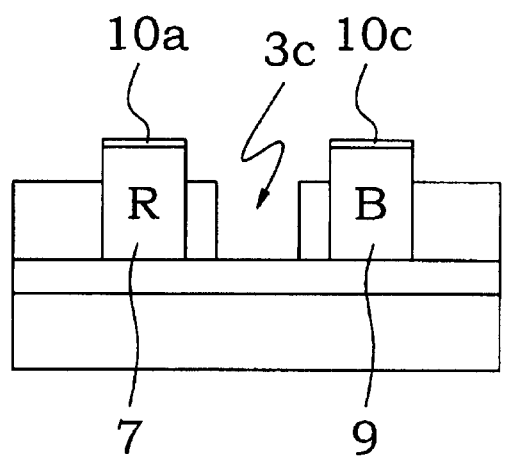
Figure 1H:
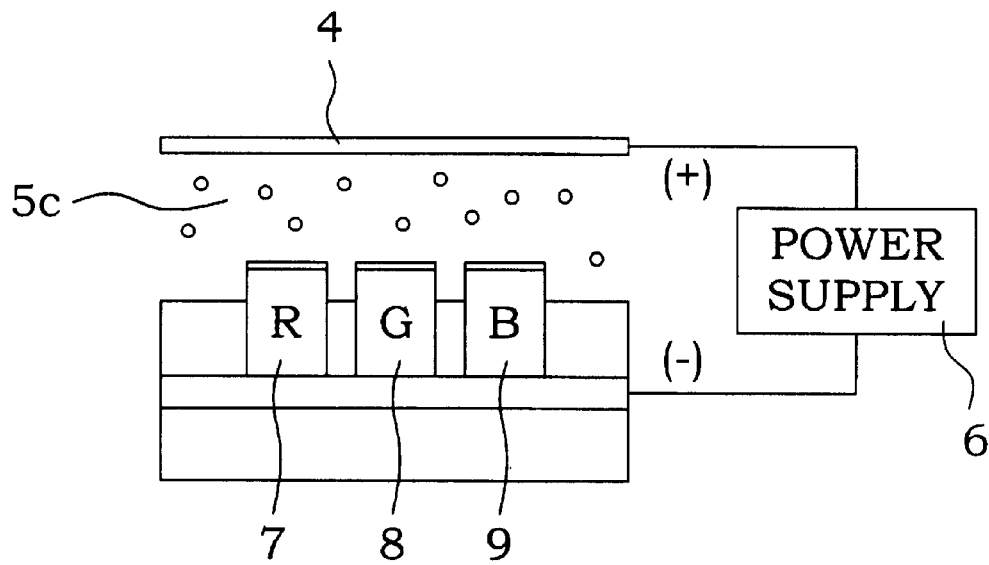
Figure 1I:
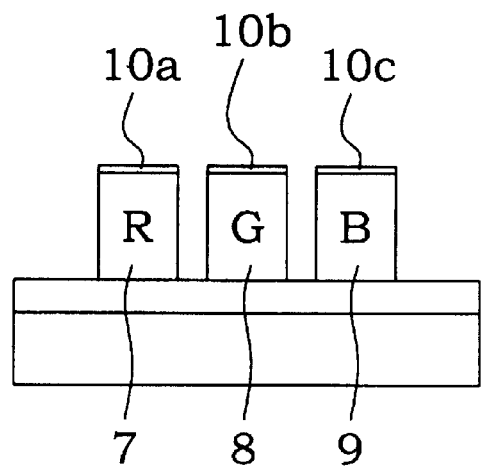
Figure 2A:
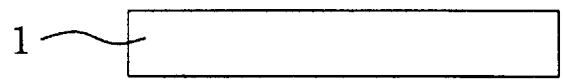
FIGS. 2a through 2d are sectional views showing a process for fabricating a UV curable layer on a phosphor coated by an electrophoretic deposition method.
Figure 2B:
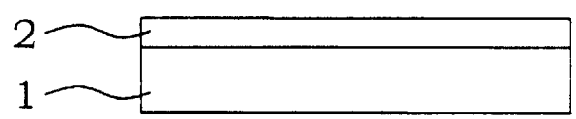
Figure 2C:
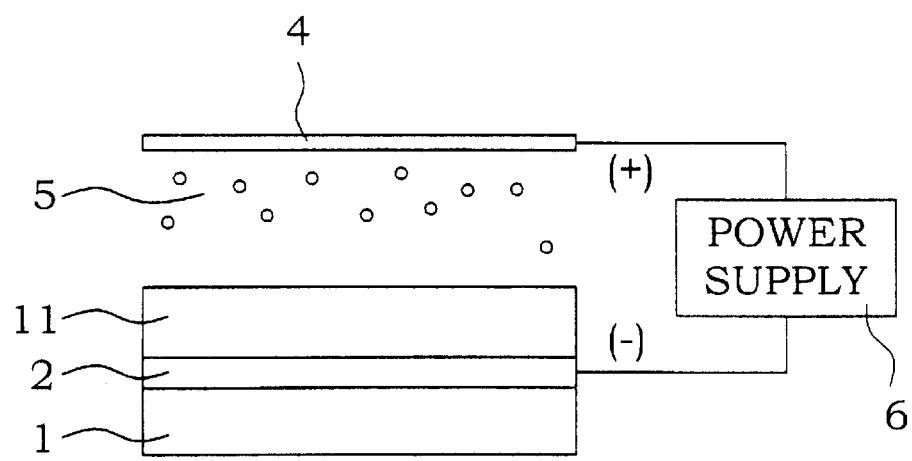
Figure 2D:
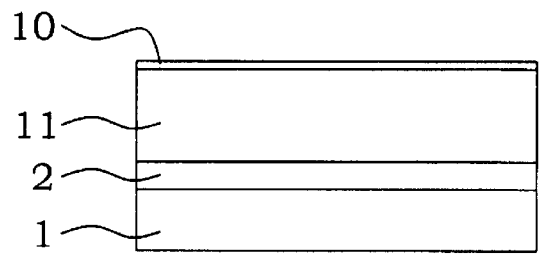

Meanwhile, in the cases of the green and blue phosphors G and B, the above process is repeated as shown in FIGS. 1g through 1h, to thereby form a RGB phosphor pattern cells 7–9 shown in FIG. 1i. The RGB phosphor pattern cell 7–9 forms a single pixel cell.

That is, in the case that a RGB phosphor pattern is made, the UV curable layer 10a is cured using a precisely designed mask. In the case that the RGB phosphor pattern is made, the red phosphor (R) pattern cell 7 is formed as shown in FIGS. 1a through 1d and sequentially a new photoresist 3 is coated as shown in FIGS. 1e and 1g. Then, the photoresist 3 of portions where a corresponding phosphor will be coated is etched by photolithography, to thereby form windows 3b and 3c with respect to the conductive layer 2, respectively.

Then, blue and green phosphor suspensions 5b and 5c are prepared. Using the blue and green phosphor suspensions 5b and 5c, the blue and green phosphors B and G are coated by EPD as shown in FIGS. 1f and 1h, respectively, to thereby form a blue (B) phosphor pattern cell 8 and a green phosphor (G) pattern cell 9 on the conductive layer 2. Also, UV curable layers 10b and 10c are formed as shown in FIGS. 1g and 1i.

If a PVA+ADC aqueous solution is used as a photoresist, a pattern is made via a thermal treatment process such as a post-process of the EPD. In the case that a UV curable layer is not made, an addition agent such as glycerin or cellulose is put to enhance an adhesive strength of the phosphor. Even in this case, the adhesive strength is much smaller than that when the UV curable layer is made.

FIGS. 2a through 2d are sectional views showing a process for fabricating a UV curable layer on a phosphor coated by an electrophoretic deposition method;

As shown in FIGS. 2a through 2d, in the case that a RGB phosphor pattern is not formed but a single phosphor is coated, a conductive layer 2 is formed on a glass substrate 1 and a phosphor 11 is coated on the upper portion of the conductive layer 2 by EPD using the aqueous solution in which the phosphor to be coated has been dispersed. Thereafter, a UV curable layer 10 is coated as an adhesive layer to then perform a curing process.

Properties of the phosphor coated film that has been coated on the glass substrate according to the present invention will now be described through various experiments.

Figure 3:
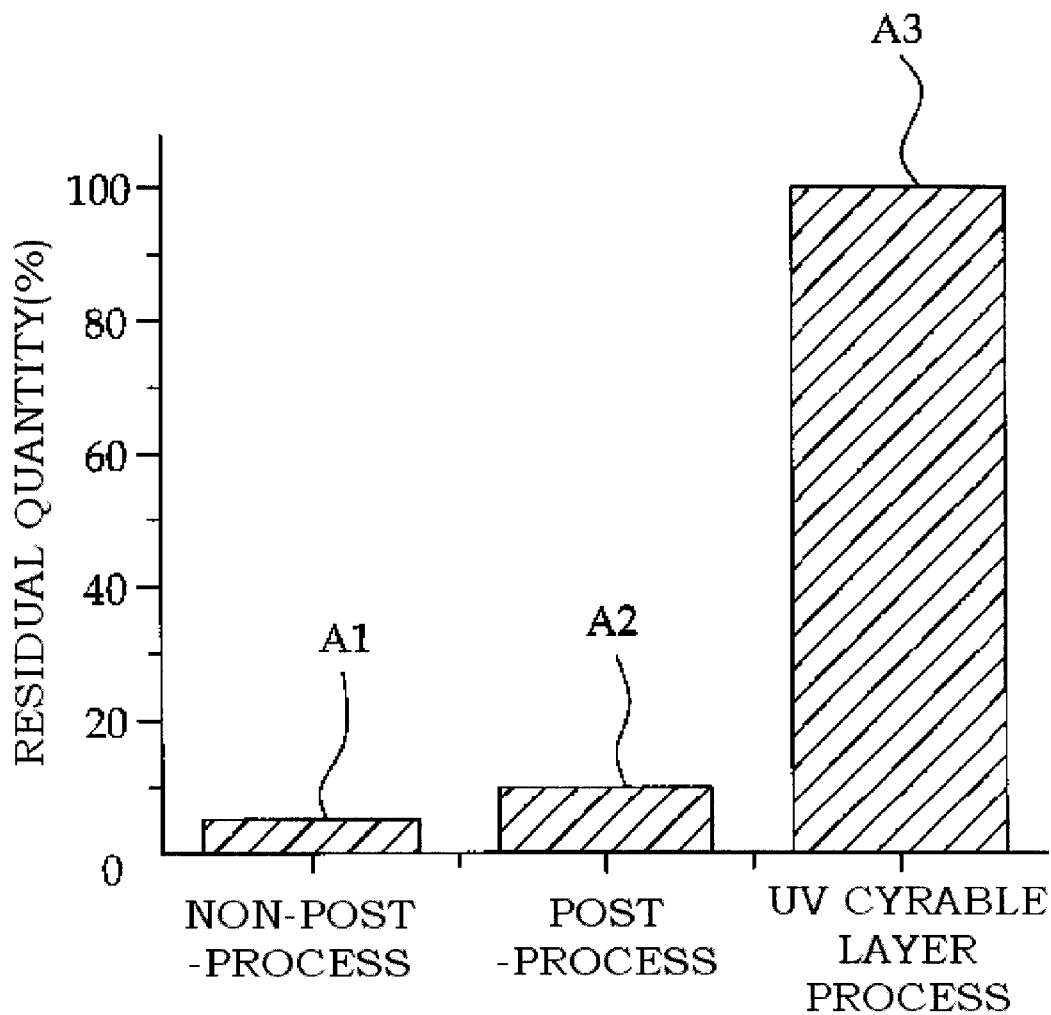
FIG. 3 is a graphical view illustrating phosphor residual quantity measurement data with respect to the respective cases that a post-process is not passed through, the post-process has been passed through and a UV curable layer is made for a curing process.

FIG. 3 is a graphical view illustrating phosphor residual quantity measurement data with respect to a case A1 that a post-process is not passed through, after a phosphor has been coated by EPD, in the case A2 that the post-process has been passed through according to the conventional art, in the case A3 that a UV curable layer according to the present invention is made for a curing process.

As can be seen from FIG. 3, in the case A3 that the UV curable layer according to the present invention is made for a curing process, although nitrogen is blown at 50–70 psi, the coated phosphor remains nearly as it is about 100%. Thus, it can be seen that an adhesive strength has been greatly enhanced, in comparison with the case A1 that a post-process has not been passed, and the case A2 that the post-process has been passed, both of which the phosphor residual quantities are smaller than 10%. It is judged that this phenomenon is because an adhesive strength of the phosphor is increased since the aqueous solution constituting the UV curable layer is cured at the state where the former has been penetrated between the particles of the coated phosphor.

Figure 4A:
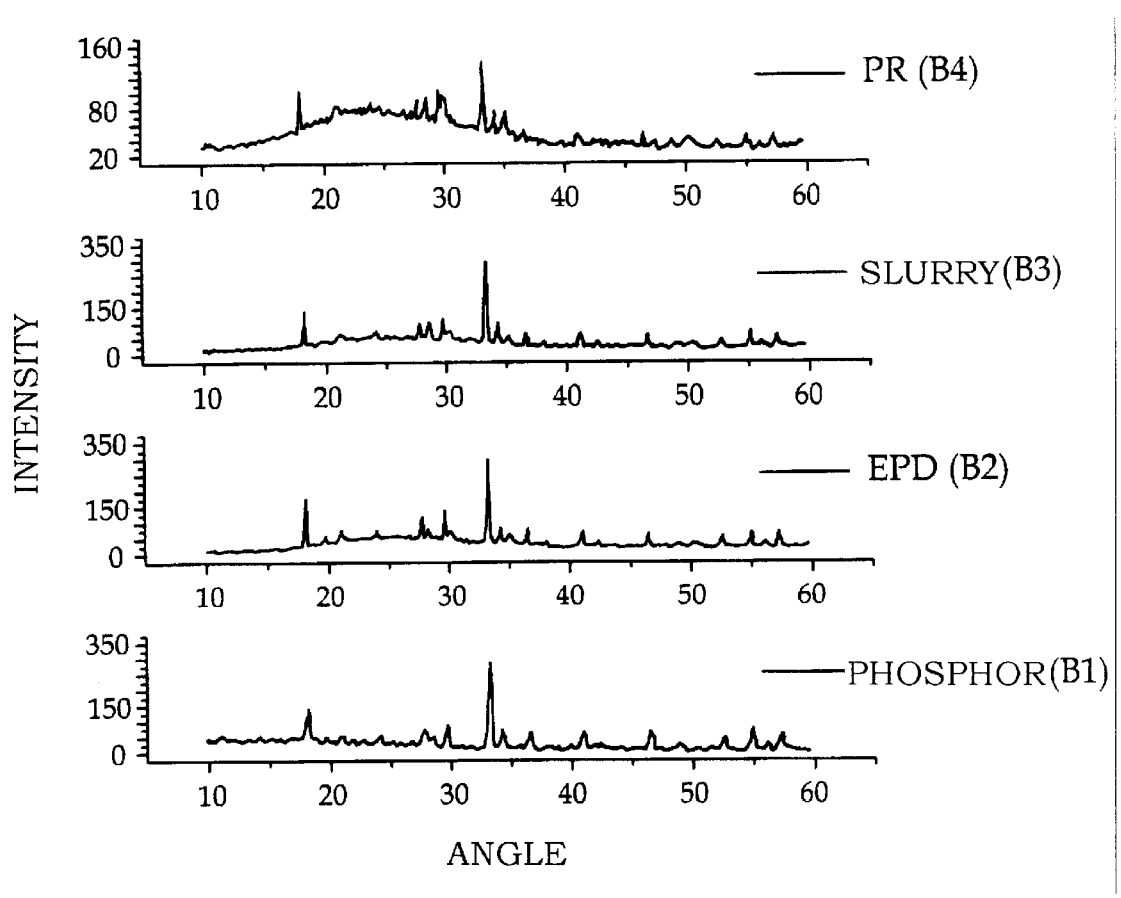
FIG. 4a are graphical views illustrating X-ray diffraction (XRD) data with respect to the respective cases that a photoresist (PR) or a polyvinyl alcohol (PVA) plus ammonium dichromate (ADC) that is used in an EPD is $Y_3Al_5O_{12}:Ce_{0.05}$ phosphor powder itself, the former is coated on an indium tin oxide (ITO) glass substrate through an EPD method, the former is dispersed in a PVA+ADC aqueous solution and then coated, and the former is dispersed in the photoresist (PR) and then coated, in order to judge whether the PR or the PVA+ADC is chemically reacted with a phosphor.

FIG. 4a are graphical views illustrating X-ray diffraction (XRD) data with respect to the case B1 that a photoresist (PR) or a polyvinyl alcohol (PVA) plus ammonium dichromate (ADC) that is used in an EPD is $Y_3Al_5O_{12}:Ce_{0.05}$ phosphor powder itself, the case B2 that the former is coated on an indium tin oxide (ITO) glass substrate through an EPD method, the case B3 that the former is dispersed in a PVA+ADC aqueous solution and then coated, and the case B4 that the former is dispersed in the photoresist (PR) and then coated, in order to judge whether the PR or the PVA+ADC is chemically reacted with a phosphor.

As can be seen from FIG. 4a, positions of the X-ray peaks are all same. Accordingly, it can be seen that the PR or the PVA+ADC that is used in the EPD has not been chemically reacted with the phosphor.

Figure 4B:
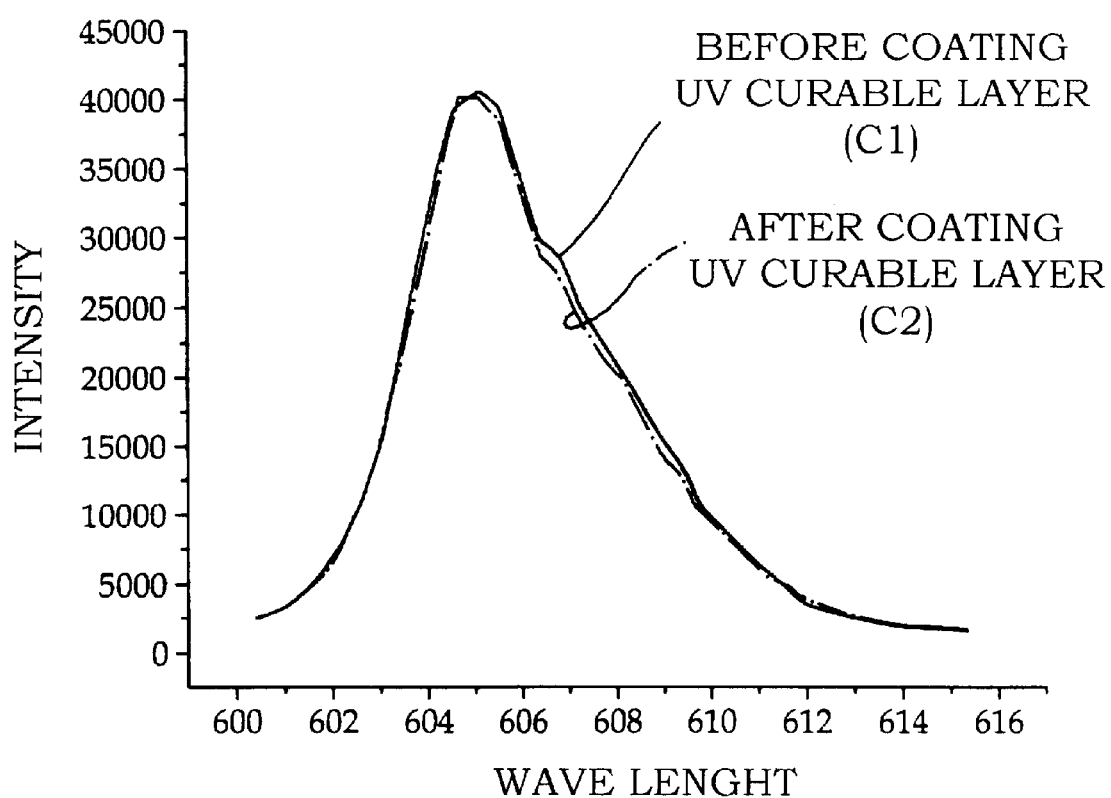
FIG. 4b is a graphical view illustrating spectra that are produced before or after a UV curable layer is or has been formed after a $(Y_{1-0.036}Eu_{0.036})_2O_3$ phosphor has been coated on an ITO using an EPD method, in order to examine an emitting efficiency of the phosphor, in which the spectra are compared via a CCD (charge coupled device) camera.

FIG. 4b is a graphical view illustrating spectra C1 and C2 that are produced before or after a UV curable layer is or has been formed after a $(Y_{1-0.036}Eu_{0.036})_2O_3$ phosphor has been coated on an ITO using an EPD method, in order to examine an emitting efficiency of the phosphor, in which the spectra are compared via a CCD (charge coupled device) camera, in which the X-axis represents wavelength and the Y-axis represents intensity.

In the above inspection, a UV light source that has been used for curing the UV curable layer is a UV lamp of 254 nm at a 22 W power capacity. As shown in FIG. 4b, even in the case C2 that the UV curable layer according to the present invention has been coated, it can be seen that a light emitting efficiency of the coated phosphor has little difference in comparison with the case C1 that the phosphor has not been coated.

Figure 5A:
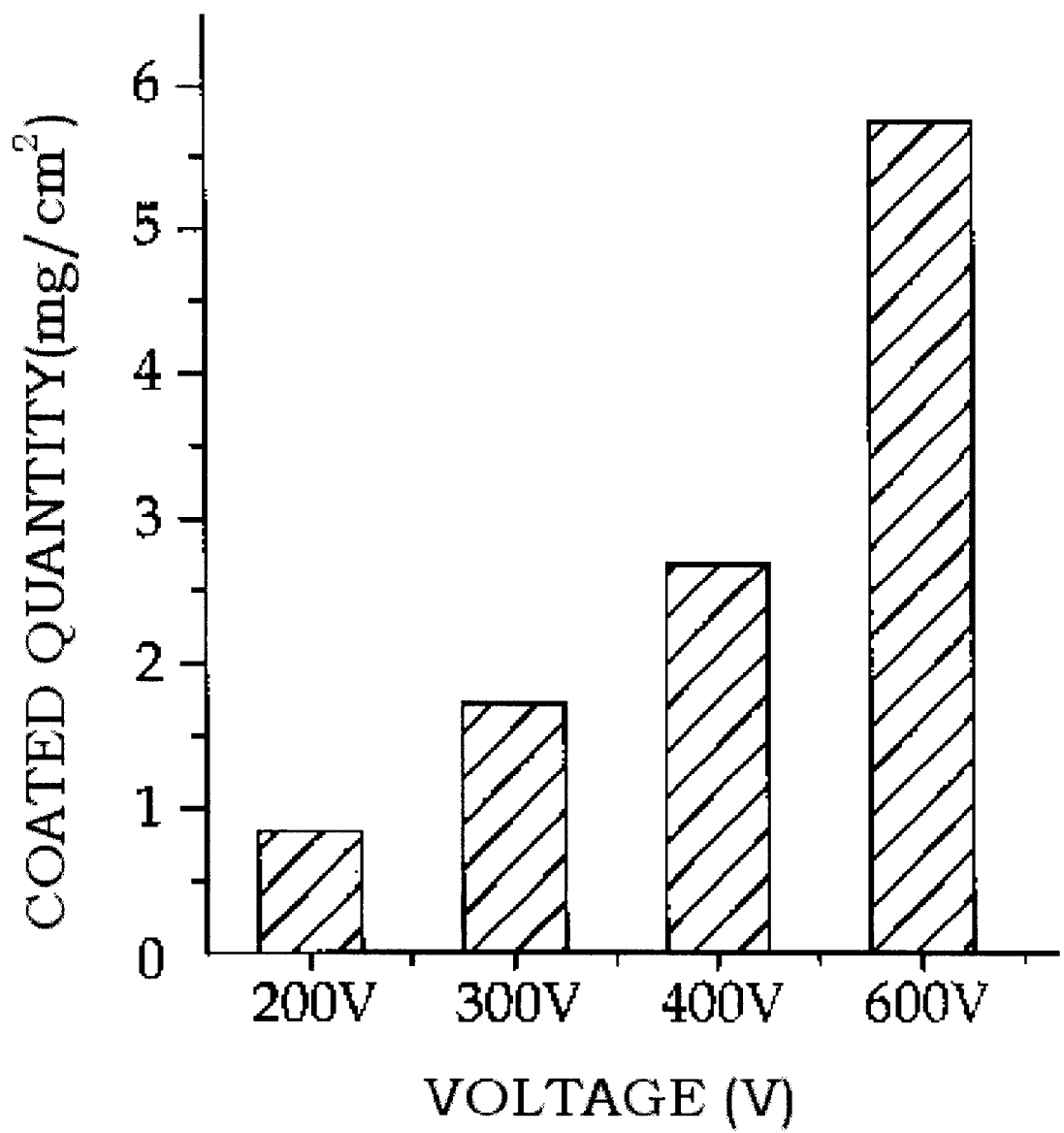
FIG. 5a is a graphical view illustrating a quantity of the coated phosphor respectively according to voltage of 200V through 600V when a $Y_3Al_5O_{12}:Ce_{0.05}$ phosphor is coated on an ITO glass substrate via an EPD method.

FIG. 5a is a graphical view illustrating a quantity (mg/cm$^2$) of the coated phosphor respectively in the cases that a voltage applied between the conductive layer and the counter-electrode is changed according to voltage of 200V through 600V when a $Y_3Al_5O_{12}:Ce_{0.05}$ phosphor is coated on an ITO glass substrate via an EPD method. As shown in FIG. 5a, it can be seen that as the voltage becomes higher, the more phosphor has been coated.

Figure 5B:
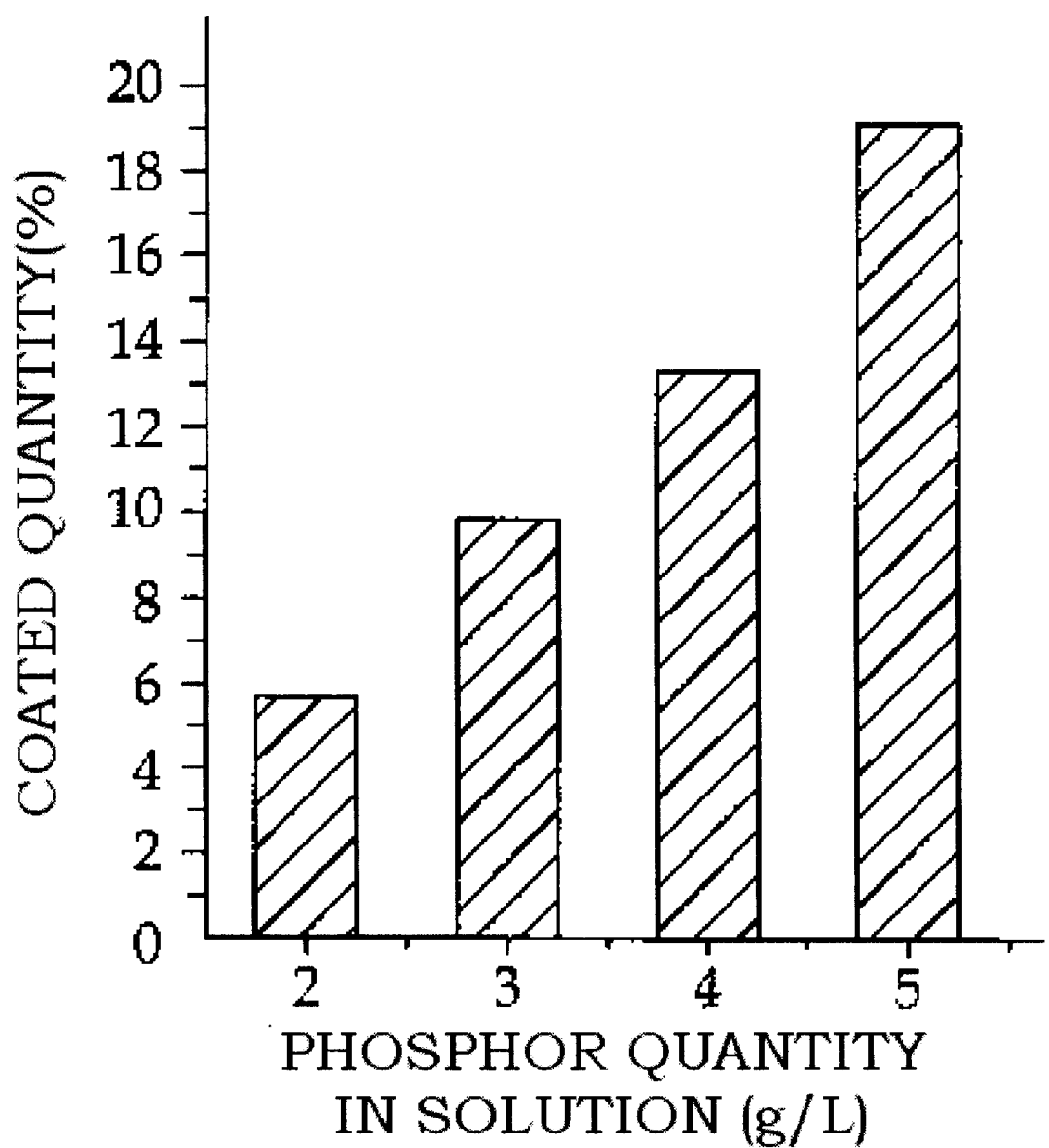
FIG. 5b is a graphical view illustrating a quantity of the coated phosphor respectively according to a quantity (g/L) of the phosphor contained in the suspension when a $Y_3Al_5O_{12}:Ce_{0.05}$ phosphor is coated on an ITO glass substrate via an EPD method.

FIG. 5b is a graphical view illustrating a quantity (mg/cm$^2$) of the coated phosphor respectively according to a quantity (g/L) of the phosphor contained in the dispersed aqueous solution when a $Y_3Al_5O_{12}:Ce_{0.05}$ phosphor is coated on an ITO glass substrate via an EPD method. As shown in FIG. 5b, it can be seen that as the quantity of the phosphor is increased in the aqueous solution, the more phosphor has been coated.

Figure 6:
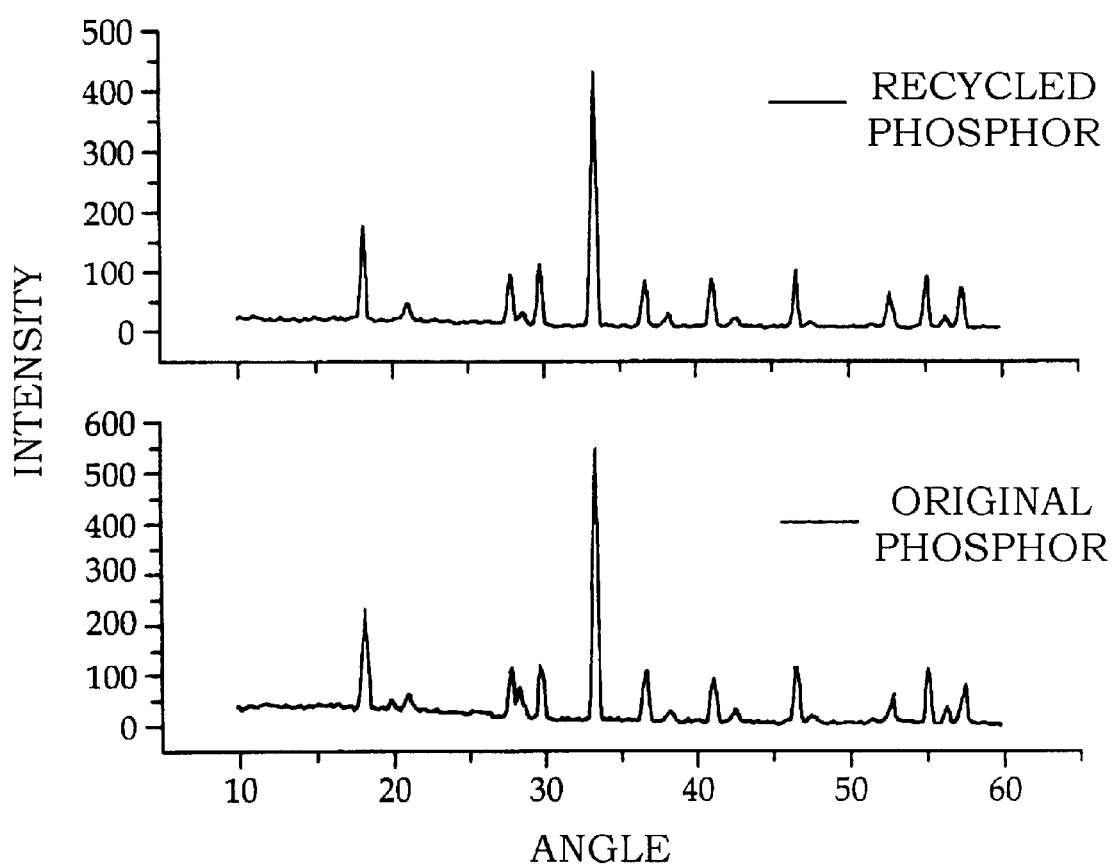
FIG. 6 is a graphical view illustrating X-ray diffraction (XRD) data in which a phosphor remaining in the suspesion is collected in the form of powder, after the phosphor has been coated by an EPD method, and then the collected powder-formed phosphor is compared with an original phosphor.

FIG. 6 is a graphical view illustrating X-ray diffraction (XRD) data in which a phosphor remaining in the phosphor dispersion aqueous solution is evaporated at 100° C. or higher for one hours or longer and is then collected in the form of powder through a sonic device, after the phosphor has been coated by an EPD method, and then the collected powder-formed phosphor is compared with an original phosphor, by using the X-ray diffraction data (XRD). As shown in FIG. 6, since the position of a peak D2 with respect to the collected phosphor is accurately consistent with that of the peak D1 with respect to the original phosphor, it can be seen that a residual phosphor can be re-used at the time of coating a phosphor.

As described above, in the case that the phosphor powders have been coated by the EPD in the prior art, a post-process such as a thermal treatment process should be performed in order to enhance an adhesive strength of the phosphor and the substrate. However, the present invention can enhance an adhesive strength without having passed through the above post-process. In the present invention, the UV curable layer is coated on the coated phosphor as an adhesive layer and then an adhesive strength of the phosphor can be greatly increased through a UV irradiation, in comparison with a high-temperature thermal treatment process. Further the present invention that does not pass through the high-temperature thermal treatment process can greatly lower a production inferiority of a display that uses a glass substrate.

Also, the UV curable layer can be lithographically etched by the UV light. Accordingly, the phosphor can be coated by a predetermined pattern. As a result, the present invention can be applied to a next-generation display such as a FED or PDP as an optimal method for full color realization. Further, since glycerin that lowers a light emitting efficiency need not be used as an addition agent, the light emitting efficiency can be increased.

While there have been illustrated and described what are considered to be a specific preferred embodiment of the present invention, it will be understood by those skilled in the art that the present invention is not limited to the specific embodiment thereof, and various changes and modifications and equivalents may be substituted for elements thereof without departing from the true scope of the present invention.

What is claimed is:

1. A method for coating a phosphor on a flat display, the method comprising the steps of:

forming a conductive layer on a glass substrate;

forming at least one phosphor pattern cell at a predetermined location of said conductive layer by coating a phosphor on the conductive layer by electrophoretic deposition (EPD) of a phosphor suspension containing phosphor particles to be coated dispersed therein; and adhering said phosphor particles together and to said conductive layer by coating an upper surface of said at least one phosphor pattern cell with a UV curable layer and irradiating said UV curable layer with UV light.

2. The method of claim 1, wherein said UV curable layer contains an aqueous solution of polyvinyl alcohol (PVA) and ammonium dichromate (ADC).

3. The method of claim 2, wherein said UV curable layer is applied by a spraying, dipping or spin coating technique.

* * * * *